(12) United States Patent
Kojima et al.

(10) Patent No.: US 7,683,009 B2
(45) Date of Patent: Mar. 23, 2010

(54) OXIDE SUPERCONDUCTOR THICK FILM AND METHOD FOR MANUFACTURING THE SAME

(75) Inventors: Masahiro Kojima, Chiyoda-ku (JP);
Masakazu Kawahara, Chiyoda-ku (JP);
Michiharu Ichikawa, Yokosuka (JP);
Hiroyuki Kado, Yokosuka (JP);
Masatoyo Shibuya, Yokosuka (JP)

(73) Assignees: Central Research Institute of Electric Power Industry, Yokosuka-shi (JP);
DOWA Electronics Materials Co., Ltd., Tokyo (JP)

( * ) Notice: Subject to any disclaimer, the term of this patent is extended or adjusted under 35 U.S.C. 154(b) by 480 days.

(21) Appl. No.: 11/549,873

(22) Filed: Oct. 16, 2006

(65) Prior Publication Data
US 2007/0142232 A1    Jun. 21, 2007

Related U.S. Application Data

(62) Division of application No. 10/630,862, filed on Jul. 31, 2003, now abandoned.

(30) Foreign Application Priority Data
Dec. 5, 2002    (JP)    ............................ 2002-354309

(51) Int. Cl.
*H01L 39/24*    (2006.01)
(52) U.S. Cl. ...................... 505/234; 505/230; 505/237; 505/238; 505/782; 427/62
(58) Field of Classification Search ................. 505/230, 505/234, 237, 238, 782
See application file for complete search history.

(56) References Cited

U.S. PATENT DOCUMENTS 4,968,664 A    11/1990    Sugihava et al.

(Continued)

FOREIGN PATENT DOCUMENTS

DE    203 15 783    2/2004

(Continued)

OTHER PUBLICATIONS

N. H. Sinh, "Properties of the Bi-Surplus Superconducting $Bi_{2.1-x}Pb_xSr_2Ca_2Cu_3O_y$ Compounds", Journal of Magnetism and Magnetic Materials, vol. 262, No. 3, pp. 514-519, Jun. 2003.

(Continued)

*Primary Examiner*—Stanley Silverman
*Assistant Examiner*—Paul Wartalowicz
(74) *Attorney, Agent, or Firm*—Oliff & Berridge, PLC

(57) ABSTRACT

The present invention provides a Bi2223 based thick film that does not peel off when a thermal or a mechanical shock is applied to a base or an oxide superconductor thick film or the like in the middle of a manufacturing process and a method of manufacturing the same. An oxide superconductor paste 1 having a mixing ratio of Bi2212 composition is applied to a base 3, dried, burned, and thereafter burned at a temperature approximate to its melting point to obtain a partially molten layer 4. Next, an oxide superconductor paste 2 having a mixing ratio of Bi2223 composition is applied to the partially molten layer 4, dried, burned, compressed by a CIP, and thereafter repeatedly burned and compressed for a predetermined number of times to obtain the base 3 having a desired superconductor thick film 5 formed thereon.

8 Claims, 7 Drawing Sheets

U.S. PATENT DOCUMENTS

| | | | |
|---|---|---|---|
| 5,079,226 A * | 1/1992 | Sakai et al. | 505/213 |
| 5,180,707 A * | 1/1993 | Gao et al. | 505/471 |
| 5,428,005 A * | 6/1995 | Matsuura et al. | 505/234 |
| 6,027,826 A * | 2/2000 | deRochemont et al. | 428/702 |
| 6,069,116 A * | 5/2000 | Li et al. | 505/431 |
| 6,271,473 B1 * | 8/2001 | Tanaka et al. | 174/125.1 |
| 6,809,042 B2 * | 10/2004 | Kojima et al. | 438/785 |
| 2003/0096709 A1 | 5/2003 | Kojima et al. | |
| 2004/0110641 A1 | 6/2004 | Kojima et al. | |
| 2005/0170969 A1 | 8/2005 | Kojima et al. | |

FOREIGN PATENT DOCUMENTS

| | | |
|---|---|---|
| EP | 0 412 199 | 2/1991 |
| JP | 02-199023 | 8/1990 |
| JP | 06-318412 | 11/1994 |
| JP | 07-002524 A | 1/1995 |
| JP | 2004-026625 | 1/2004 |
| WO | WO 92/13649 | 8/1992 |

OTHER PUBLICATIONS

K. Ohbayashi et al., "High-$T_c$ (95 K) As-Grown Superconducting Bi-Sr-Ca-Cu-O Thin Films", Japanese Journal of Applied Physics, Part 2 (Letters), vol. 29, No. 11, pp. L2049-L2052, Nov. 1990.

* cited by examiner

OXIDE SUPERCONDUCTOR THICK FILM AND METHOD FOR MANUFACTURING THE SAME

This is a Division of application Ser. No. 10/630,862 filed on Jul. 31, 2003. The disclosure of the prior application is incorporated herein by reference in its entirety.

BACKGROUND OF THE INVENTION

1. Field of the Invention

The present invention relates to an oxide superconductor thick film containing Bi, Pb, Sr, Ca and Cu having a high critical current density and a high adhesiveness to an oxide substrate or an oxide base, and a method for manufacturing the same.

2. Description of the Related Art

An oxide substrate or an oxide base such as MgO, alumina or YSZ, or a metal substrate or a metal base such as Ag, Au, Pt or Ni is formed with an oxide superconductor in thick film form to function, so as to devise a variety of applied products.

As a method of forming this oxide superconductor into film form, a technique is tried in which an oxide superconductor powder, to which an appropriate organic binder is added, is made into paste form, thereafter applied to the substrate or the base using the screen printing method, the doctor blade method, the spray method, or the like, and burned to thereby form a polycrystalline oxide superconductor thick film.

This technique of forming the oxide superconductor thick film using an oxide superconductor paste has a quite low manufacturing cost, that is, an advantage because of no need for an expensive single crystal substrate and a large-scale and expensive apparatus requiring a high vacuum system represented by PVD, CVD or the like, and thus it is considered as the technique closest to practical use.

When an application of this oxide superconductor thick film to a practical product is considered, an adoption of a thick film containing $(Bi, Pb)_{2+a}Sr_2Ca_2Cu_3O_z$ (generally, $0<a<0.5$) (hereinafter, described as Bi2223 based thick film) as an oxide superconductor thick film material is prospective from two perspectives of required superconducting characteristics and manufacturing costs including raw materials and manufacturing processes.

A method of forming the Bi2223 based thick film is explained below.

First, a Bi based superconductive paste is applied to an oxide base such as MgO, alumina, or YSZ using the screen printing method, the doctor blade method, the spray method, or the like. At this stage, an oxide superconductor powder in the Bi based superconductive paste applied to the base has a $(Bi, Pb)_2Sr_2Ca_1Cu_2O_z$ phase (hereinafter, described as Bi2212 phase) whose critical temperature is between Tc and approximately 80 K as a main phase, and not the $(Bi, Pb)_{2+a}Sr_2Ca_2Cu_3O_z$ phase (hereinafter, described as Bi2223 phase) whose critical temperature is between Tc and approximately 110 K. This oxide superconductor powder is a multi-phase which also includes an intermediately generated phase such as $Ca_2PbO_4$, $CaCuO_2$, or CuO.

Then the Bi based superconductive paste is heat treated, so that a reaction occurs between the $(Bi, Pb)_2Sr_2Ca_1Cu_2O_z$ and the intermediately generated phase to make the $(Bi, Pb)_{2+a}Sr_2Ca_2Cu_3O_z$, and thus the Bi2223 phase is generated from the Bi2212 phase and the intermediately generated phase. As a result, an oxide superconductor thick film containing the Bi2223 phase having a high critical temperature is formed on the oxide base.

Although it is important to have a high critical temperature when the oxide superconductor thick film is applied to a practical product, it is also required to have a high critical current density (hereinafter, described as Jc). Further, when the oxide superconductor thick film is applied to a practical product, a Jc of more than 5,000 A/cm² is required.

Generally, to attain a Jc of more than 5,000 A/cm² using a thick film containing the above-mentioned Bi2223 phase (hereinafter, described as Bi2223 thick film), plate crystals having large ab faces and short c axes, which are peculiar to the Bi based oxide superconductor, are appropriately oriented so as to align their ab faces, on which a superconducting current easily flows, in the conducting direction. Consequently, a compressing operation using a CIP (Cold Isostatical Press), or an HIP (Hot Isostatical Press) is adopted for aligning the plate crystals in the conducting direction.

However, even with the high Jc attained by using such compressing operation, when a substantial cross-sectional area of the thick film on which the superconducting current flows was small, an adequate net value of the superconducting current cannot be attained, and thus it is not suitable for practical use. Therefore, it is necessary to design a Bi2223 thick film in a way that the cross-sectional area for an adequate critical current value (Ic) is assured.

Accordingly, following processes are normally taken in order to form an oxide superconductor thick film having a high Jc and a high critical current value on a base.

The patent document 1 is referred as an example.

1. A Bi based oxide superconductor paste is applied to an appropriately selected oxide base to have more thickness than a predetermined film thickness.

2. A first burning is conducted to the oxide base having the Bi based oxide superconductor paste applied thereon.

3. After the first burning, the oxide base is placed in a CIP and compressed therein.

4. The burning of the process 2 and the compressing of the process 3 are repeated for an appropriate number of times. After the last burning is completed, the oxide base having the Bi2223 thick film applied thereon is obtained.

Patent document 1: Japanese Patent Application Laid-open No. 2001-358298

In the above-described method of forming a Bi2223 thick film related to the prior art, a peeling of a thick film from an oxide base occurs frequently in the middle of a film-forming process, which lowers an yield of a process and thus decreases productivity. This peeling phenomenon commonly occurs during a burning or after a CIP, especially during a first burning or after a first CIP. The present inventors conducted a study on this peeling phenomenon of the thick film from the oxide base, and then found following factors.

First, the peeling during a burning attributes to:

1. a difference in a coefficient of thermal expansion (linear expansion) between an oxide base and a superconductor, 2. a cubical volume change due to an expansion of a whole thick film that occurs concurrently with a transformation of a crystal structure to generate a high Tc phase from a low Tc phase and an intermediately generated phase.

In particular, an effect of the factor 2 is dominant during a first burning, and thus it is considered to be a main cause for the frequent occurrence of peeling during a burning.

Next, the peeling after a CIP attributes to:

3. a phenomenon of force in such a direction as to peel a thick film from an oxide base. This force is generated as a residual stress inside the thick film when the thick film and the oxide base having the thick film formed thereon are compressed with a predetermined isostatic pressure (0.5 to 3.0 ton/cm²), and thereafter, the residual stress is released to take the above effect when the thick film and the oxide base are decompressed. In addition, this phenomenon of force prominently affects an oxide base in cylindrical shape.

The present inventors conducted an analysis of the Bi2223 thick film formed on a base related to the prior art. The results of this analysis are explained below with reference to FIG. 7. FIG. 7 is an optical microphotography of a cross section of the Bi2223 thick film formed on an MgO base related to the prior art.

In FIG. 7, a reference numeral 51 designates a cross section of the MgO base, a reference numeral 59 designates the cross section of the Bi2223 thick film related to the prior art, and a reference numeral 53 designates an interface between the MgO base 51 and the Bi2223 thick film 59. In a detailed observation of FIG. 7, it is found that a fracture surface 58 is generated in an area of approximately 2 µm to 10 µm from the interface 53 in the Bi2223 thick film 59. The present inventors further conducted similar analysis to a large number of Bi2223 thick films related to the prior art, and recognized that a fracture surface exists in an oxide superconductor thick film not only in a case that an oxide superconductor thick film peels off from an oxide base in the middle of a manufacturing process, but also in a case that the thick film does not peel off from the oxide base.

When a fracture surface is relatively large, an oxide superconductor thick film peels off from an oxide base during a burning or a CIP compression in the middle of a manufacturing process. When the fracture surface is small, the oxide superconductor thick film does not peel off from the oxide base in the middle of a manufacturing process. However, the fracture surface develops every time a thermal or a mechanical shock is applied to the oxide superconductor thick film, which finally leads to the peeling of the oxide superconductor thick film.

SUMMARY OF THE INVENTION

From the above described results of the study, a problem that the present invention solves is to provide a Bi2223 thick film that does not peel off when a thermal or a mechanical shock is applied to a base or an oxide superconductor thick film in the middle of a manufacturing process and a method of manufacturing the same.

A first means for solving the above problem is an oxide superconductor thick film containing Bi, Pb, Sr, Ca, and Cu and substantially having a composition of $(Bi, Pb)_{2+a}Sr_2Ca_2Cu_3O_z$ (Note: $0<a<0.5$) to be formed on a surface of a substrate or a base, wherein no fracture surface exists in the vicinity of an interface between the substrate or the base and the oxide superconductor thick film in the oxide superconductor thick film.

The existence of the fracture surface can be confirmed, for example, by cutting several random locations of a base having an oxide superconductor thick film formed thereon using a diamond cutter or the like in such a manner that cross sections of the base and the thick film are exposed, and then observing these cross sections using an optical microscope. Generally, if no fracture surface is confirmed in these cross sections, it can be inferred that no fracture surface exists over the whole oxide superconductor thick film. In a Bi2223 thick film having the above-mentioned composition, no fracture surface exists over the whole thick film, so that a peeling of the thick film from the substrate or the base can be prevented when a heating, a cooling, a compressing, or a mechanical shock is applied to the substrate, the base or the oxide superconductor thick film in the middle of a manufacturing process or after the manufacturing process.

A second means is a method for manufacturing an oxide superconductor thick film in such a manner that an oxide superconductor thick film containing Bi, Pb, Sr, Ca and Cu is formed on a surface of a substrate or a base, comprising, forming a first thick film substantially having a composition of $Bi_2Sr_2Ca_1Cu_2O_z$ on the surface of the substrate or the base, and thereafter, forming an oxide superconductor thick film substantially having a composition of $(Bi, Pb)_{2+a}Sr_2Ca_2Cu_3O_z$ (Note: $0<a<0.5$) on the first thick film.

According to the method for manufacturing the Bi2223 thick film having the composition described above, the Bi2223 thick film in which no fracture surface exists can be easily formed.

DETAILED DESCRIPTION OF THE PREFERRED EMBODIMENT

Hereinafter, an embodiment of the present invention is explained in detail with reference to the drawings.

Figure 1:
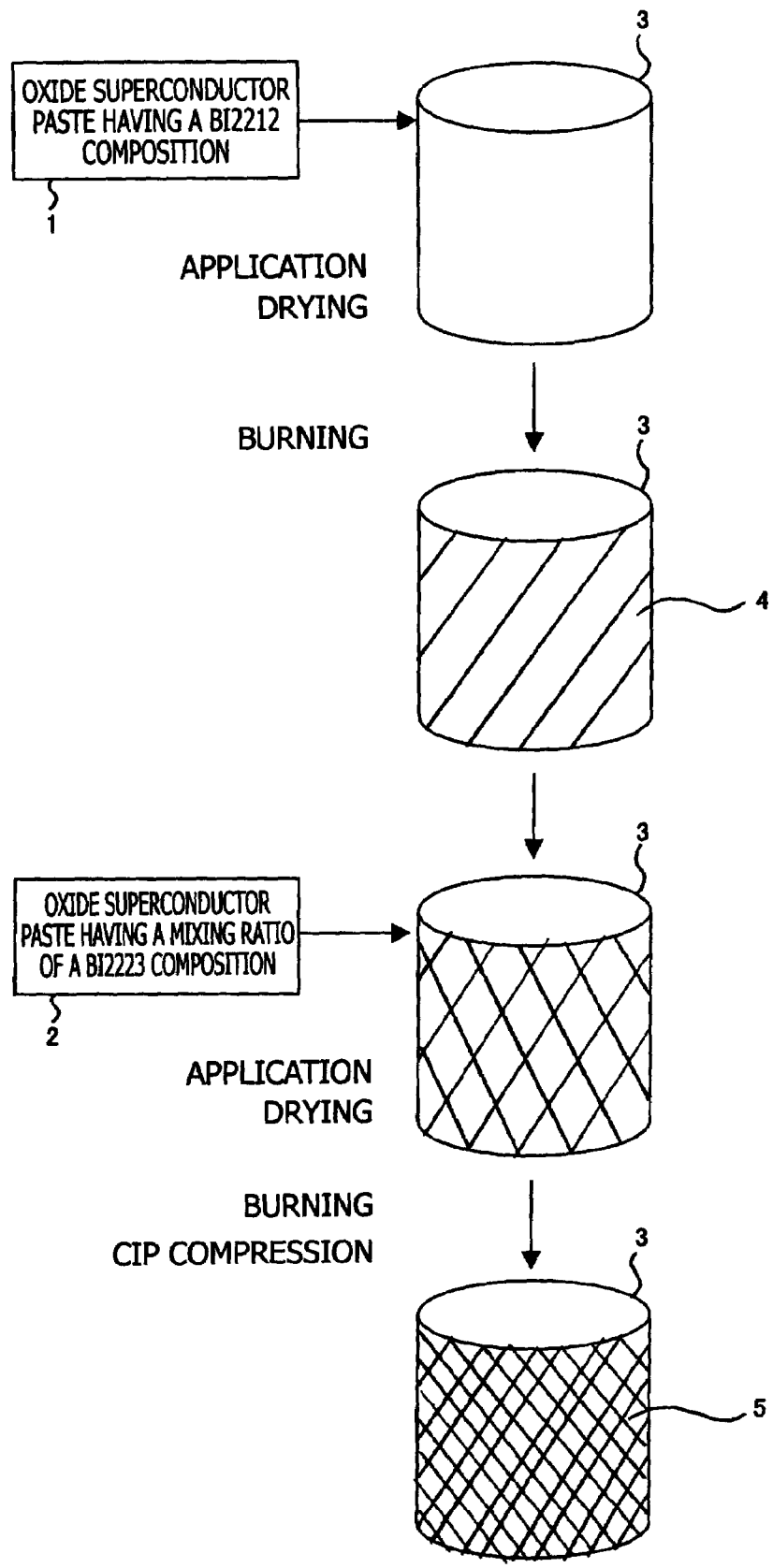
FIG. 1 is a flow process chart showing steps of forming an oxide superconductor thick film according to the present invention.

FIG. 1 is a flow chart showing steps of forming an oxide superconductor thick film related to the present invention on a substrate or a base, in which an MgO cylindrical base is used as the base for example. First, manufacturing steps of the oxide superconductor thick film related to the embodiment of the present invention is explained with reference to FIG. 1.

For example, a substrate or a base (hereinafter, described as base) 3 formed with ceramics, etc., is prepared. An oxide superconductor paste having a mixing ratio of the Bi2212 composition (hereinafter, described as Bi2212 paste) 1 is applied to the base 3 and dried. (A preferred manufacturing method of such Bi2212 paste 1 will be described later.) After completion of the drying, the base 3 having the Bi2212 paste 1 applied thereon is heated in the atmosphere at 880° C. to 885° C. for 10 to 30 min., and the Bi2212 paste 1 is burned at a temperature approximate to its melting point. The Bi2212 paste 1 burned at a temperature approximate to its melting point becomes partially molten state. As a result, the base 3 is in a state on which a Bi2212 partially molten layer 4 substantially having the composition of $Bi_2Sr_2Ca_1Cu_2O_z$ as a first thick film is formed.

Then, an oxide superconductor paste having a mixing ratio of the Bi2223 composition (hereinafter, described as Bi2223 paste) 2 is applied to this base 3, on which the Bi2212 partially molten layer 4 is formed, and dried. (A preferred manufacturing method of such Bi2223 paste 2 is described later.) After completion of the drying, the base 3 having the Bi2223 paste 2 applied thereon is heated in the atmosphere at 830° C. to 860° C. for 50 to 100 hrs., and the Bi2223 paste 2 is burned. The base 3 having the Bi2223 paste 2 burned thereon is compressed at a pressure of 2 ton/cm$^2$ to 3 ton/cm$^2$ using a CIP (Cold Isostatic Press), and thereafter, the burning and the compressing are repeated for a predetermined number of times. After the last burning, the oxide base 3 having a Bi2223 thick film 5 formed thereon is obtained.

Next, the above-mentioned steps to obtain the base 3 having the desired oxide superconductor thick film 5 formed thereon is explained in detail below.

First, a cylindrical base or a plate-shaped substrate formed with a ceramic material such as MgO, alumina, or YSZ, or a metal material such as Ag, Au, Pt, or Ni can be used as the base 3, so that a material with appropriate quality, shape, and size may be selected according to a final purpose of manufacture. However, from perspectives of low reactivity and high adhesiveness (high bonding strength), the MgO is a preferable material for the base 3.

For applying the Bi2212 paste 1 to the base 3, a technique such as brushing, dipping, or spraying can be used. However, the spraying is a preferred technique for applying efficiently to a large area.

When applying the Bi2212 paste 1 to the base 3, a preferable film thickness is 10 to 100 μm. The film thickness more than 10 μm is preferable because a partial unevenness can be prevented, so that an after-mentioned even bonding strength can be attained. On the other hand, the film thickness less than 100 μm is preferable because a Bi2212 film reacts adequately with the Bi2223 paste in an after-mentioned post-process.

After the Bi2212 paste 1 is applied to the base 3 and adequately dried, it is heated in the atmosphere at 880° C. to 885° C., burned for 10 to 30 min., and returned to a room temperature. Since the temperature is approximate to a melting point of the Bi2212 in the atmosphere, the applied Bi2212 becomes partially molten, so that the base 3 is in a state that a Bi2212 partially molten layer 4 exists thereon. A film thickness of the Bi2212 partially molten layer 4 is approximately 40 μm.

Next, the Bi2223 paste 2 is further applied above the Bi2212 partially molten layer 4 formed on the base 3. An application technique may be the same as the application technique for the above-mentioned Bi2212 paste 1. At this time, the film thickness is preferred to be thicker the better, preferably more than 200 μm.

After the Bi2223 paste 2 is applied above the Bi2212 partially molten layer 4 and adequately dried, it is heated in the atmosphere at 830° C. to 860° C., more preferably 835° C. to 850° C., burned for 50 to 100 hrs., and returned to the room temperature. Then, the whole base is placed in the CIP and compressed at a pressure of 2 ton/cm$^2$ to 3 ton/cm$^2$. By this compression, a density of the plate crystals of the $(Bi, Pb)_{2+a}Sr_2Ca_2Cu_3O_z$ generated by the burning, is increased from less than 3 to more than 4. The Jc is also increased from approximately 100 A/cm$^2$ to approximately 5000 A/cm$^2$ because the plate crystals are appropriately oriented so as to align their ab faces in the conducting direction, in which a superconducting current easily flows.

After completion of the compressing, the whole base is removed from the CIP, heated again in the atmosphere at 830° C. to 860° C., more preferably 835° C. to 850° C., burned for 50 to 100 Hrs., and returned to the room temperature. As a result, a sintered film 5 of the Bi2223 formed on the base 3 was obtained. Furthermore, the sintered film of Bi2223 obtained by the above-mentioned steps did not peel from the base 3.

Here, structure observations are made for the sintered film of the Bi2223, etc., which does not peel from the base 3, and observation results are explained with reference to the drawings.

Figure 3:
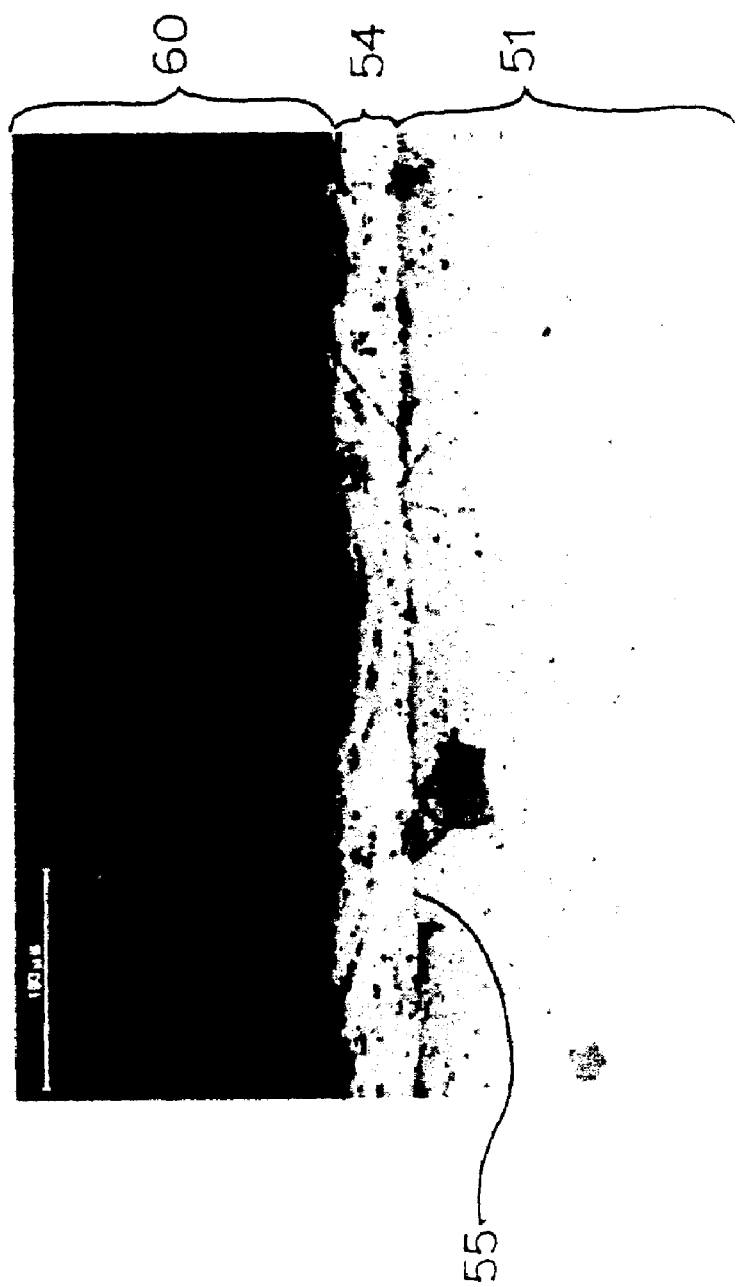
FIG. 3 is an optical microphotography of a cross section of an oxide superconductor thick film according to the present invention.

FIG. 3 is an optical microphotography of a cross-sectional structure of a Bi2212 partially molten layer 54, which is shown by the reference numeral 4 in FIG. 1, formed on an MgO base 51 through an interface 55.

Figure 4:
FIG. 4 is an optical microphotography of a different cross section of the oxide superconductor thick film according to the present invention.

FIG. 4 is an optical microphotography of a cross-sectional structure of a Bi2223 sintered film 52, which is shown by the reference numeral 5 in FIG. 1, formed on the base 51 through the interface 55 and the Bi2212 partially molten layer 54.

FIG. 5A to FIG. 5F are results of line-analysis of each constituting element in a direction of film thickness using an EPMA conducted on the Bi2223 sintered film shown in FIG. 4 from a surface to the base.

FIG. 6A to FIG. 6D are charts showing results of X-ray diffraction measurement conducted on the Bi2223 sintered film shown in FIG. 4 from the surface to the base.

In an observation of the Bi2212 partially molten layer 54 in FIG. 3, it is observed that crystal grains are partially melted and filled in pores between the crystal grains because the burning temperature is approximate to the melting point of the Bi2212 in the atmosphere, thereby strengthening a bonding between the crystal grains to form a dense film. Further, at the interface 55 between the Bi2212 partially molten layer 54 and the MgO base 51, it is observed that the Bi2212 partially molten layer 54 is rigidly engaged into imperceptible gaps and irregularities on a surface of the MgO base 51.

Furthermore, at the interface between the Bi2212 partially molten layer 54 and the MgO base 51, it is conceivable that an interactive element diffusion occurred between a molten liquid phase and the MgO base 51 when the Bi2212 layer partially melted. As a result, it can be inferred that the Bi2212 partially molten layer 54 and the MgO base 51 are bonded strongly in both structural and chemical states. (A part above the Bi2212 partially molten layer 54 where a reference numeral 60 designates is an epoxy resin for obtaining this optical microscope sample.)

In an observation of FIG. 4, the Bi2212 partially molten layer explained in FIG. 3 is not clearly observed, just as if the Bi2223 sintered film 52 is formed through the MgO base 51 and the interface 55.

Accordingly, structures of the layer and the film in this part are further analyzed in detail.

Figure 5:
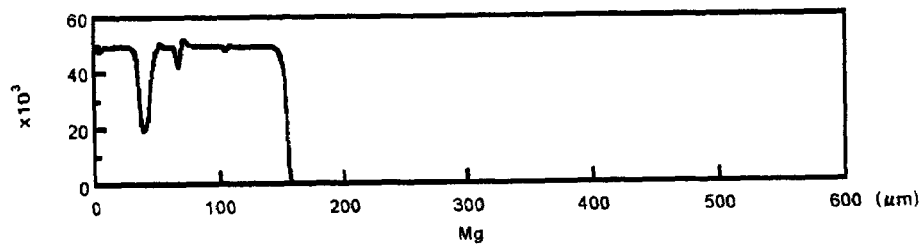
FIG. 5A to FIG. 5F are views showing results of analysis using an EPMA of the oxide superconductor thick film according to the present invention.
Figure 5:
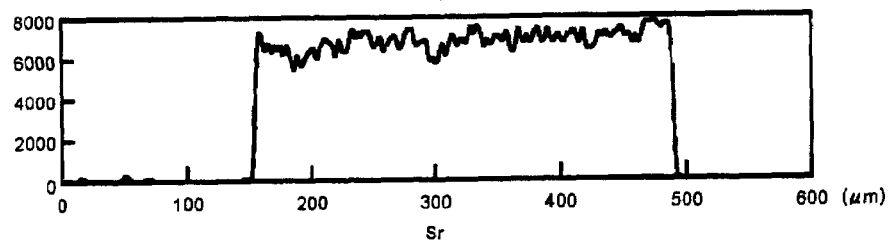
Figure 5:
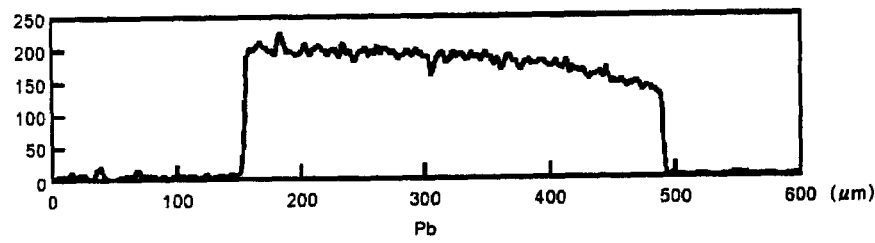
Figure 5:
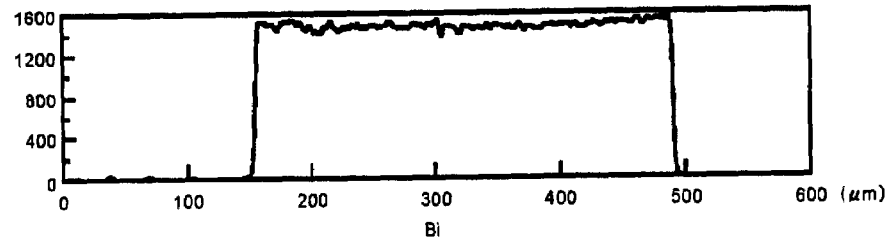
Figure 5:
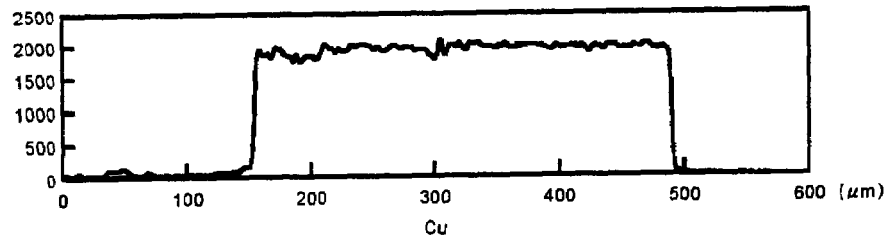
Figure 5:
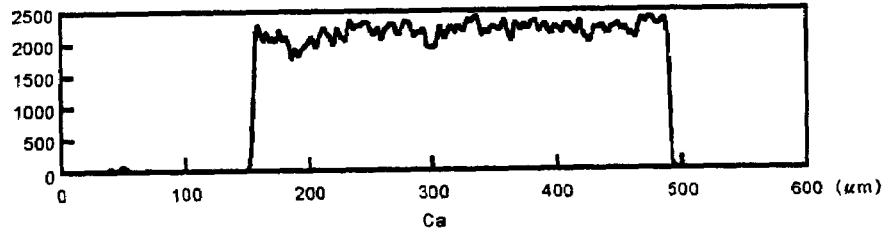
Figure 6:
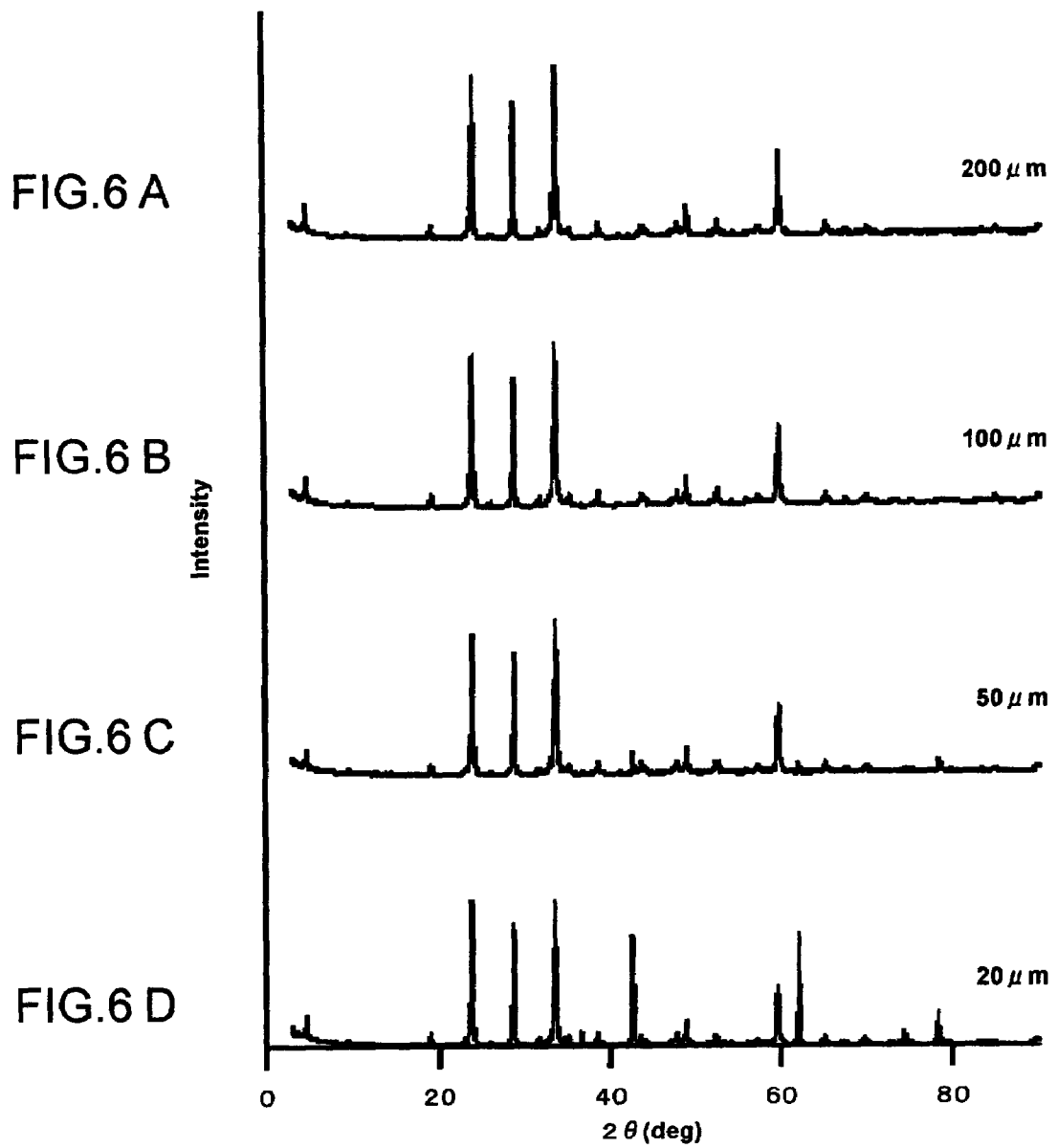
FIG. 6A to FIG. 6D are views showing results of analysis using an XRD of the oxide superconductor thick film according to the present invention.
Figure 7:
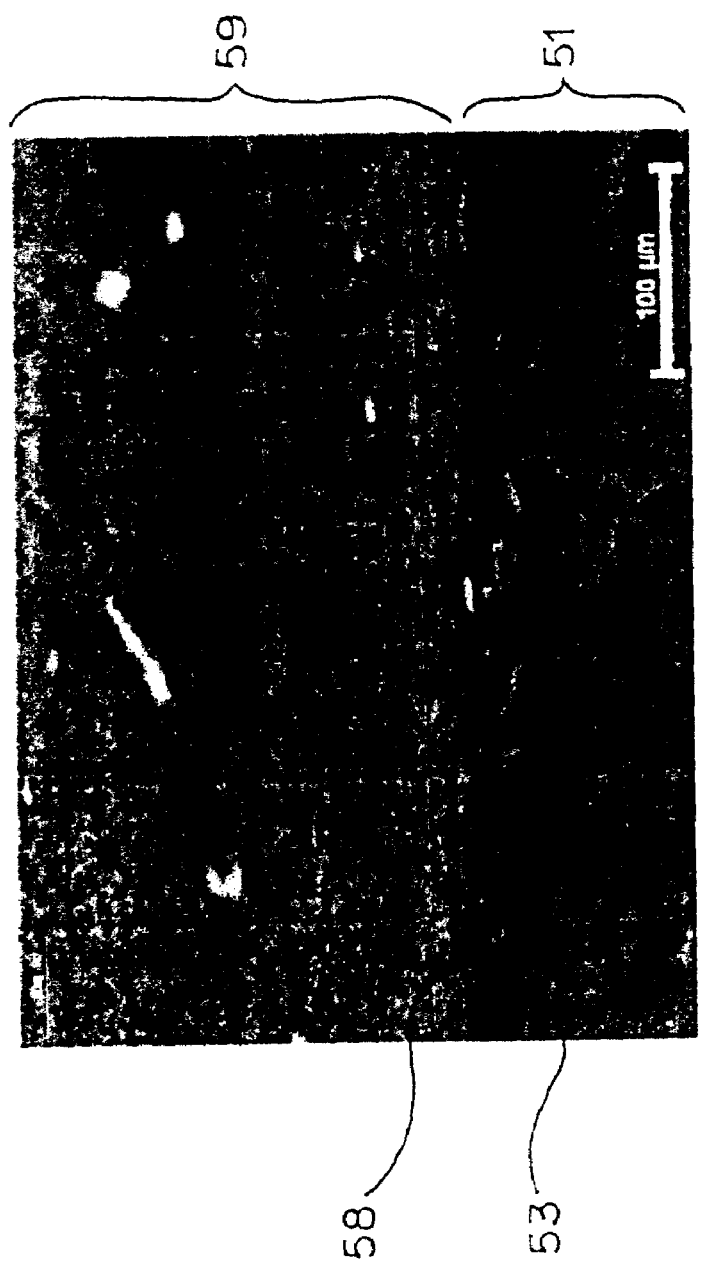
FIG. 7 is an optical microphotography of a cross section of an oxide superconductor thick film related to the prior art.

A result of analysis of Mg shown in FIG. 5A, the interface exists at approximately 150 μm from a reference point (a point where the horizontal axis is zero), and here Mg decreases rapidly with an inclination. This exhibits a phenomenon of element diffusion of Mg which constitutes the base.

From results of analysis of elements Sr, Pb, Bi, Cu, and Ca shown in FIGS. 5B to 5F, a film thickness of the film shown by reference numeral 52 in FIG. 4 measures 350 μm. It proves that the film thickness including the Bi2212 partially molten layer, which is 640 μm when the Bi2223 film is applied and dried, decreases to approximately 350 μm after the burning and compressing.

Next, the results of analysis of the elements Sr, Pb, Bi, Cu, and Ca shown in FIG. 5B to FIG. 5F are studied.

It proves that the elements Sr, Bi, Cu, and Ca exist in approximately even concentration in the film, except Pb. Normally, in the Bi2212 and the Bi2223, Ca and Cu have different composition ratios, and thus the corresponding line-analysis should exhibit commensurate changes in their strengths in the vicinity of the interface between the Bi2212 partially molten layer and the Bi2223 film. However, there are substantially no changes observed in the strengths of Ca and Cu, and their concentrations are substantially even over the whole thick film.

FIG. 5C shows that a Pb concentration in the thick film gradually decreases from the interface with the base toward the surface of the film. The decrease in the Pb concentration can be inferred from that evaporation of Pb occurs during the sintering of Bi2223 in such a way that the closer it is to the surface of the film, the more Pb evaporates to the atmosphere.

On the other hand, FIG. 5C also shows that the Pb concentration in the thick film scarcely decreased until the interface with the base. Considering the fact that the Bi2212 partially molten layer did not contain Pb when it is formed into a film, it can be inferred that diffusion of Pb occurred into the original Bi2212 partially molten layer.

Next, in results of analysis in FIG. 6A to FIG. 6D, no peak for Bi2212 is confirmed from an XRD of the thick film in a position at 20 μm from the base which was the Bi2212 partially molten layer before the burning, as well as in positions between 20 to 200 μm, and it proves that all the peaks exhibit diffraction peaks for Bi2223.

All the above results indicates that diffusion of the elements Pb, Ca, and Cu occurred from the Bi2223 film, which is formed on the Bi2212 partially molten layer, into the Bi2212 partially molten layer by the burning, so that the composition of the whole film is uniformized, and thus the most part of the Bi2212 partially molten layer including a crystal structure is transformed into Bi2223.

Here, meanings in the transformation of the most part of the Bi2212 partially molten layer into Bi2223 are considered.

First, as described above, the Bi2212 partially molten layer was strongly bonded to the base through the interface with the base. The bonding state will be preserved when the most part of the Bi2212 partially molten layer is transformed into Bi2223, and thus the strong bonding state will be maintained.

Second, it is evident that a cubical expansion of Bi2223, which occurs when the Bi2223 paste is burned to generate Bi2223, causes an expansion of the whole thick film that prevents the peeling of the thick film from the base. In other words, in a case that the Bi2223 paste is directly applied to a base such as MgO, and then a cubical expansion occurred to this Bi2223 paste, the generated Bi2223 peels off from the base. However, when the Bi2212 partially molten layer exists between the Bi2223 paste and the base, this Bi2212 partially molten layer maintains the strong bonding state with the base, absorbs Pb, Ca, and Cu provided by a paste layer of the Bi2223 composition in which crystals are being generated, and gradually transforms itself to the Bi2223. As a result, the transformation of the crystal structure in the film is given continuity just like a gradient material, which alleviates the expansion like a cushion at the interface with the base to restrain the peeling thereof.

Hereinafter, a preferred manufacturing method for both the Bi2212 paste 1 and the Bi2223 paste 2 used in the present embodiment is explained with reference to FIG. 2, which is a flow chart showing examples of preferred manufacturing steps of an oxide superconductor paste.

Figure 2:
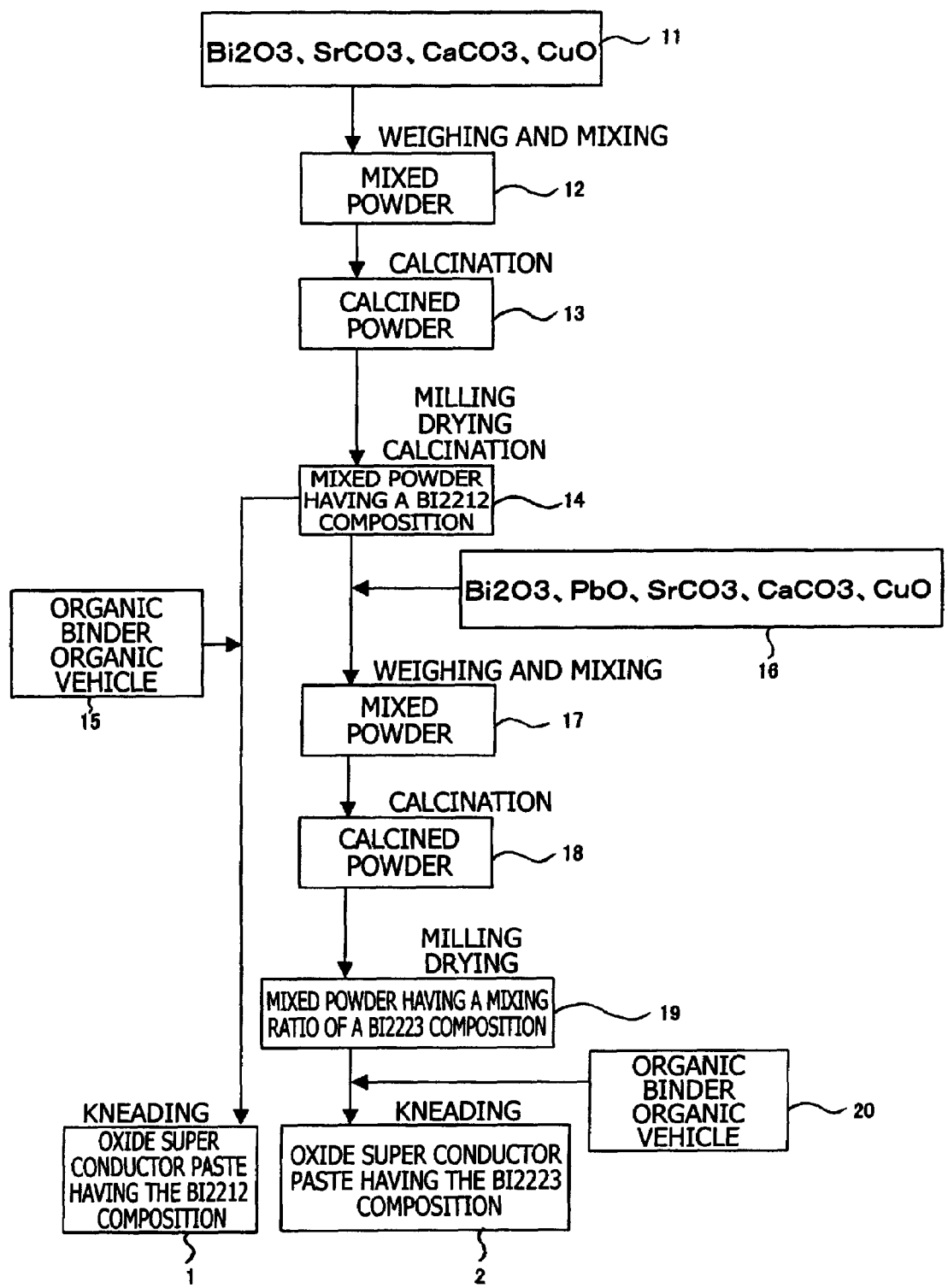
FIG. 2 is a flow process chart showing examples of manufacturing steps of an oxide superconductor paste according to the present invention.

In FIG. 2, powders 11 of $Bi_2O_3$, $SrCO_3$, $CaCO_3$ and CuO are weighed to have a mole ratio of Bi2212 and mixed together to obtain a mixed powder 12. In this case, $CaCO_3$ may be replaced with CaO or $Ca(OH)_2$. Instead of the above-mentioned mixed powder, the mixed powder 12 may be obtained by preparing elements of Bi, Sr, Ca, and Cu to have the desired mole ratio by a wet coprecipitation method or the like.

Then, the mixed powder 12 is calcined to prepare a calcined powder 13. The calcining conditions are between 600° C. and 100020 C., more preferably 750° C. and 850° C. in the atmosphere for 3 hours to 50 hours. The obtained calcined powder 13 is put into a ceramic pot together with Zr balls and an organic solvent such as toluene or the like, placed on a rotating platform, and ball-milled. The purpose of this operation is to finely mill the calcined powder 13 to improve its uniformity, so as to increase its thermal reaction in the following burning step. The calcined powder 13 in slurry form to which the ball milling has been completed is dried in a dryer. Then this calcined powder 13 is calcined again on the same calcining condition. After this calcination, the calcined powder 13 is ball-milled again and burned to obtain a mixed powder 14 having a Bi2212 composition. This mixed powder 14 is divided into two equal portions.

One portion of the divided mixed powder 14 having the Bi2212 composition is mixed with an appropriate organic binder and organic vehicle 15 and kneaded using a triple roller or the like to obtain the superconductive paste 1 having a mixing ratio of the Bi2212 composition.

Powders 16 of $Bi_2O_3$, PbO, $SrCO_3$, $CaCO_3$ and CuO are added to another portion of the divided mixed powder 14 having the Bi2212 composition, weighed to have a mole ratio of Bi2223 and mixed together to obtain a mixed powder 17. In this case, $CaCO_3$ may be replaced with CaO or $Ca(OH)_2$. Instead of the above-mentioned mixed powder, the mixed powder 17 may be obtained by preparing elements of Bi, Sr, Ca, and Cu to have the desired mole ratio by the wet coprecipitation method or the like, or another material may also be used in which elements of Bi, Pb, Sr, Ca, and Cu were prepared to have the desired mole ratio by the wet coprecipitation method or the like.

Then, the mixed powder 17 is calcined to obtain a calcined powder 18 having a mixing ratio of the Bi2223 composition. The calcining conditions are between 600° C. and 1000° C., more preferably 750° C. and 850° C. in the atmosphere for 3 hours to 50 hours. The obtained calcined powder 18 having the mixing ratio of the Bi2223 composition as a whole contains a Bi2212 phase and an intermediately generated phase such as $Ca_2PbO_4$, $CaCuO_2$, CuO, or the like.

The calcined powder 18 having the mixing ratio of the Bi2223 composition is put into a ceramic pot together with Zr balls and an organic solvent such as toluene or the like, placed on a rotating platform, and ball-milled. The purpose of this operation is to finely mill the calcined powder 13 to improve its uniformity, so as to increase its thermal reaction in the following burning step. The calcined powder 18 in slurry form having the mixing ratio of the Bi2223 composition to which the ball milling has been completed is dried in a dryer and calcined again. After this calcination, the calcined powder 18 is ball-milled again and burned to obtain a mixed powder 19 having the mixing ratio of the Bi2223 composition.

The obtained mixed powder 19 having the Bi2223 composition is mixed with an appropriate organic binder and organic vehicle 20 and kneaded using a triple roller or the like to obtain the superconductive paste 2 having the mixing ratio of Bi2223 composition.

PRACTICAL EXAMPLE

As a base to which a superconductor thick film will be applied, an MgO polycrystal in a cylindrical shape having an external diameter of 50 Φmm, an internal diameter of 40 Φmm, and a length of 100 mm was prepared. A superconductor paste having a mixing ratio of a Bi2212 composition was applied to the MgO base using a spray method and dried, and thereafter burned in the atmosphere at a burning temperature of 880° C. to 885° C. for 30 min. This temperature is approximate to a melting point of Bi2212 in the atmosphere, so that a Bi2212 partially molten layer in a partially molten state was obtained. A thickness of the Bi2212 partially molten layer was 40 μm.

Next, a superconductor paste having a mixing ratio of a Bi2223 composition was applied to the Bi2212 partially molten layer formed on the MgO base using the spray method and dried. A film thickness of the superconductor paste having the mixing ratio of the Bi2223 composition was 600 μm. Then the superconductor paste was burned in the atmosphere at a burning temperature of 850° C. for 50 hrs.

The MgO base having an oxide superconductor thick film formed thereon was placed in a CIP (Cold Isostatic Press) and compressed at a pressure of 2 ton/cm² to 3 ton/cm². Thereafter, the base was burned, compressed in CIP, and burned again on the same condition to thereby obtain a thick film sample.

The above steps were performed for ten MgO bases on the same condition. However, none of these samples had any peeling of the thick film recognized thereon.

COMPARATIVE EXAMPLE

An MgO base identical to the one used in the practical example was prepared. An oxide superconductor paste having a mixing ratio of Bi2223 composition, identical to the one used in the practical example, was applied to the MgO base and dried. A film thickness of the superconductor paste having the mixing ratio of the Bi2223 composition was 600 μm. Then, the superconductor paste was burned in the atmosphere at a burning temperature of 850° C. for 50 hrs.

At this time, ten MgO bases were prepared, and then the application and the burning were performed to them on the same condition. Five bases had peelings of the thick films occurred thereon. Subsequently, the other five MgO bases having the superconductor thick films formed thereon were compressed in the CIP, and then four of them had peelings occurred thereon. As a result, there was only one sample to which the steps of the CIP compression, the burning, the CIP compression and the last burning were completed, similarly to the samples in the practical example.

As described in detail above, the present invention provides an oxide superconductor thick film containing Bi, Pb, Sr, Ca, and Cu and substantially having a composition of (Bi, Pb)$_{2+a}$Sr$_2$Ca$_2$Cu$_3$O$_z$ (Note: 0<a<0.5) to be formed on a surface of a substrate or a base, wherein no fracture surface exists in the vicinity of an interface between the substrate or the base and the oxide superconductor thick film in the oxide superconductor thick film. In the Bi2223 thick film having the above composition, a peeling of the thick film from the substrate or the base can be prevented when a heating, a cooling, a compressing, or a mechanical shock is applied to the substrate, the base, or the oxide superconductor thick film in the middle of a manufacturing process or after the manufacturing process.

What is claimed is:

1. A method for manufacturing an oxide superconductor thick film in such a manner that an oxide superconductor thick film containing Bi, Pb, Sr, Ca and Cu is formed on a surface of a substrate or a base, comprising, burning a first thick film substantially having a composition of Bi$_2$Sr$_2$Ca$_1$Cu$_2$O$_z$ on the surface of said substrate or said base in an atmosphere at 880° C. to 885° C., and thereafter, forming an oxide superconductor thick film substantially having a composition of (Bi, Pb)$_{2+a}$Sr$_2$Ca$_2$Cu$_3$O$_z$ (Note: 0<a<0.5) on said first thick film.

2. The method for manufacturing the oxide superconductor thick film according to claim 1, wherein
the first thick film is formed from a first oxide superconductor paste having a mixing ratio of said composition of Bi$_2$Sr$_2$Ca$_1$Cu$_2$O$_z$ that is applied on the surface of the substrate or base, is dried, and thereafter is burned, and
the oxide superconductor thick film is formed from a second oxide superconductor paste having a mixing ratio of a composition of (Bi, Pb)$_{2+a}$Sr$_2$Ca$_2$Cu$_3$O$_z$ (Note: 0<a<0.5) that is applied on a surface of the burned first thick film, is dried, and thereafter is burned.

3. The method for manufacturing the oxide superconductor thick film according to claim 2, wherein
the oxide superconductor thick film is formed from the second oxide superconductor paste having said mixing ratio of the composition of (Bi, Pb)$_{2+a}$Sr$_2$Ca$_2$Cu$_3$O$_z$ (Note: 0<a<0.5) that is burned in an atmosphere at 830° C. to 860° C. for 50 to 100 hours.

4. The method for manufacturing the oxide superconductor thick film according to claim 1, wherein
the first thick film is burned in the atmosphere at 880° C. to 885° C. for 10 to 30 minutes.

5. A method for manufacturing an oxide superconductor thick film in such a manner that an oxide superconductor thick film containing Bi, Pb, Sr, Ca and Cu is formed on a surface of a substrate or a base, comprising, burning a first thick film formed from powders of Bi$_2$O$_3$, SrCO$_3$, CaCO$_3$ and CuO weighed to have a mole ratio of Bi2212 on the surface of the substrate or the base in an atmosphere at 880° C. to 885° C., and thereafter, forming an oxide superconductor thick film from powders of Bi$_2$O$_3$, PbO, SrCO$_3$, CaCO$_3$ and CuO on the first thick film.

6. The method for manufacturing the oxide superconductor thick film according to claim 5, wherein
the first thick film is formed from a first oxide superconductor paste comprising Bi$_2$O$_3$, SrCO$_3$, CaCO$_3$ and CuO weighed to have a mole ratio of Bi2212 that is applied on the surface of substrate or base, is dried, and thereafter is burned, and
the oxide superconductor thick film is formed from a second oxide superconductor paste comprising Bi$_2$O$_3$, PbO, SrCO$_3$, CaCO$_3$ and CuO that is applied on a surface of the burned first thick film, is dried, and thereafter is burned.

7. The method for manufacturing the oxide superconductor thick film according to claim 6, wherein
the oxide superconductor thick film is formed from the second oxide superconductor paste that is burned in an atmosphere at 830° C. to 860° C. for 50 to 100 hours.

8. The method for manufacturing the oxide superconductor thick film according to claim 7, wherein
the first thick film is burned in the atmosphere at 880° C. to 885° C. for 10 to 30 minutes.

* * * * *